(12) United States Patent
Yoshimura et al.

(10) Patent No.: US 11,380,545 B2
(45) Date of Patent: Jul. 5, 2022

(54) PROCESSING METHOD AND SUBSTRATE PROCESSING APPARATUS

(71) Applicant: Tokyo Electron Limited, Tokyo (JP)

(72) Inventors: Shota Yoshimura, Miyagi (JP); Kiyohito Ito, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/671,407

(22) Filed: Nov. 1, 2019

(65) Prior Publication Data
US 2020/0144051 A1 May 7, 2020

(30) Foreign Application Priority Data

Nov. 7, 2018 (JP) .............. JP2018-210072

(51) Int. Cl.
| | |
|---|---|
| *H01L 21/02* | (2006.01) |
| *H01L 21/027* | (2006.01) |
| *H01L 21/311* | (2006.01) |
| *C23C 16/56* | (2006.01) |
| *C23C 16/04* | (2006.01) |
| *C23C 16/50* | (2006.01) |
| *H01L 21/3065* | (2006.01) |

(52) U.S. Cl.
CPC ........ *H01L 21/0273* (2013.01); *C23C 16/042* (2013.01); *C23C 16/50* (2013.01); *C23C 16/56* (2013.01); *H01L 21/3065* (2013.01); *H01L 21/31116* (2013.01); *H01L 21/31144* (2013.01)

(58) Field of Classification Search
CPC ............. H01L 21/0273; H01L 21/3065; H01L 21/31116; H01L 21/31144; H01L 21/0212; H01L 21/02274; H01L 21/02115; H01L 21/0337; H01L 21/3083; H01L 21/67213; C23C 16/56; C23C 16/042; C23C 16/50
USPC .................................. 438/696–714
See application file for complete search history.

(56) References Cited

U.S. PATENT DOCUMENTS

| | | | | |
|---|---|---|---|---|
| 8,592,327 B2 * | 11/2013 | Ranjan | ............. | H01L 21/31116 438/786 |
| 9,922,839 B2 | 3/2018 | Wise et al. | | |
| 2007/0181530 A1 * | 8/2007 | Huang | ................ | H01L 21/0273 216/67 |
| 2010/0068885 A1 * | 3/2010 | Cirigliano | ........... | H01L 21/0337 438/703 |
| 2013/0267097 A1 * | 10/2013 | Srivastava | ........ | H01J 37/32082 438/710 |
| 2015/0037943 A1 * | 2/2015 | Park | ....................... | H01L 27/124 438/158 |

FOREIGN PATENT DOCUMENTS

| | | |
|---|---|---|
| JP | 2010-516059 | 5/2010 |
| WO | 2008/086361 | 7/2008 |

* cited by examiner

*Primary Examiner* — Duy Vu N Deo
(74) *Attorney, Agent, or Firm* — IPUSA, PLLC

(57) ABSTRACT

There is provision of a processing method including a) depositing deposits on a patterned mask layer formed over an etching film; b) removing a part of the mask layer, a part of the deposits, or both the part of the mask layer and the part of the deposits; and c) repeating a) and b) at least once, thereby causing a taper angle of a side surface of a pattern formed in the mask layer to be a desired angle.

13 Claims, 18 Drawing Sheets

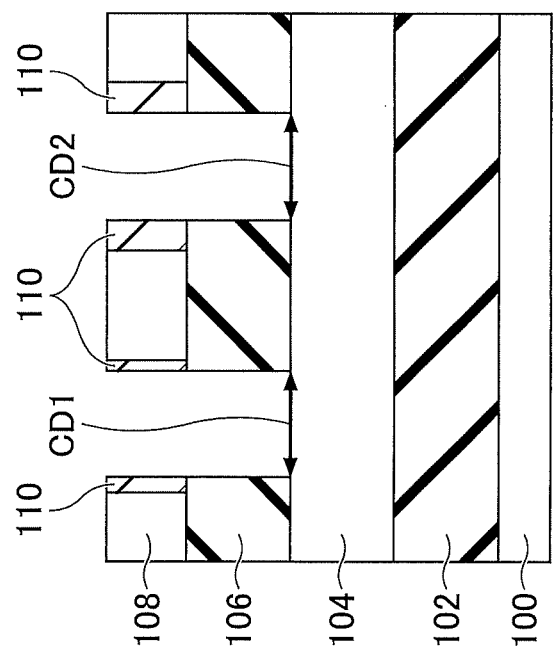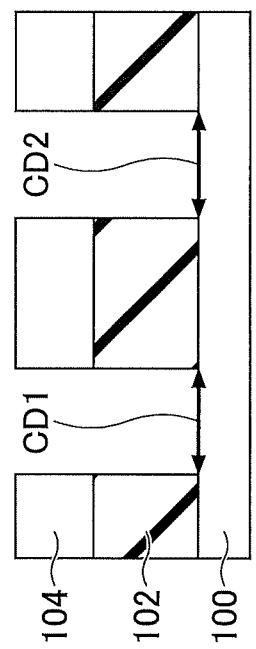

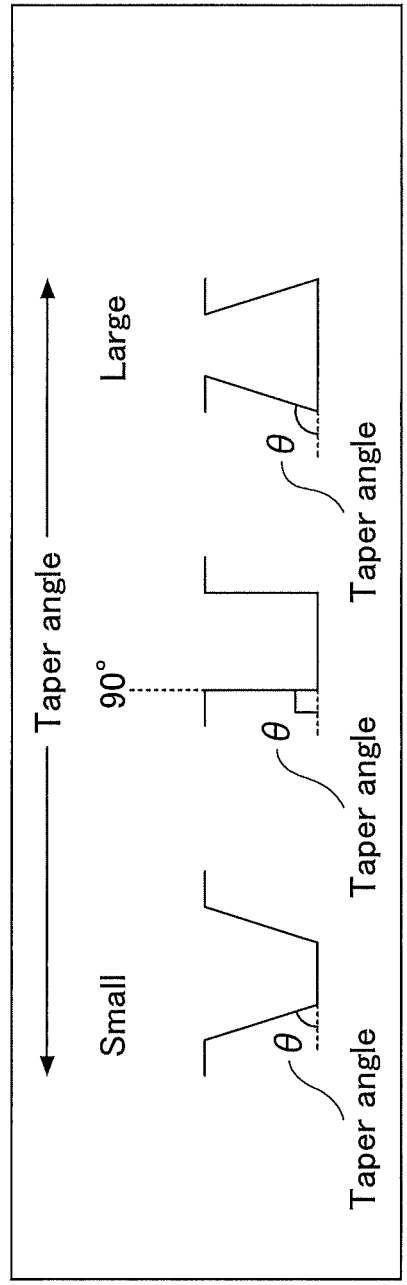

PROCESSING METHOD AND SUBSTRATE PROCESSING APPARATUS

CROSS-REFERENCE TO RELATED APPLICATIONS

This patent application is based upon and claims priority to Japanese Patent Application No. 2018-210072 filed on Nov. 7, 2018, the entire contents of which are incorporated herein by reference.

TECHNICAL FIELD

The present disclosure relates to a processing method and a substrate processing apparatus.

BACKGROUND

For example, Patent Document 1 proposes a technique for reducing irregularity of a pattern, which includes a step of depositing deposits on a recess of a hole or line pattern and a step of etching off protuberances.

For example, Patent Document 2 proposes a method including a step of providing a patterned photoresist mask, a step of depositing a coating on the photoresist mask, a step of etching features in the etching layer, and a step of removing the photoresist mask.

CITATION LIST

Patent Document

[Patent Document 1] U.S. Pat. No. 9,922,839
[Patent Document 2] Japanese National Publication of International Patent Application Publication No. 2010-516059

SUMMARY

The present disclosure provides a technique for suppressing variation in mask patterns.

According to one aspect of the present disclosure, there is provision of a processing method including a) depositing deposits on a patterned mask layer formed over an etching film; b) removing a part of the mask layer, a part of the deposits, or both the part of the mask layer and the part of the deposits; and c) repeating a) and b) at least once, thereby causing a taper angle of a side surface of a pattern formed in the mask layer to be a desired angle.

BRIEF DESCRIPTION OF THE DRAWINGS

FIGS. 2A to 2F each illustrate an example of a step included in a substrate processing method according to the embodiment;

FIG. 5B is a diagram illustrating a definition of the taper angle in the present embodiment;

DETAILED DESCRIPTION OF EMBODIMENTS

In the following, embodiments of the present invention will be described with reference to the drawings. Note that in the following descriptions and the drawings, elements having substantially identical features are given the same reference symbols and overlapping descriptions may be omitted.

Overall Configuration of Substrate Processing Apparatus

Figure 1:
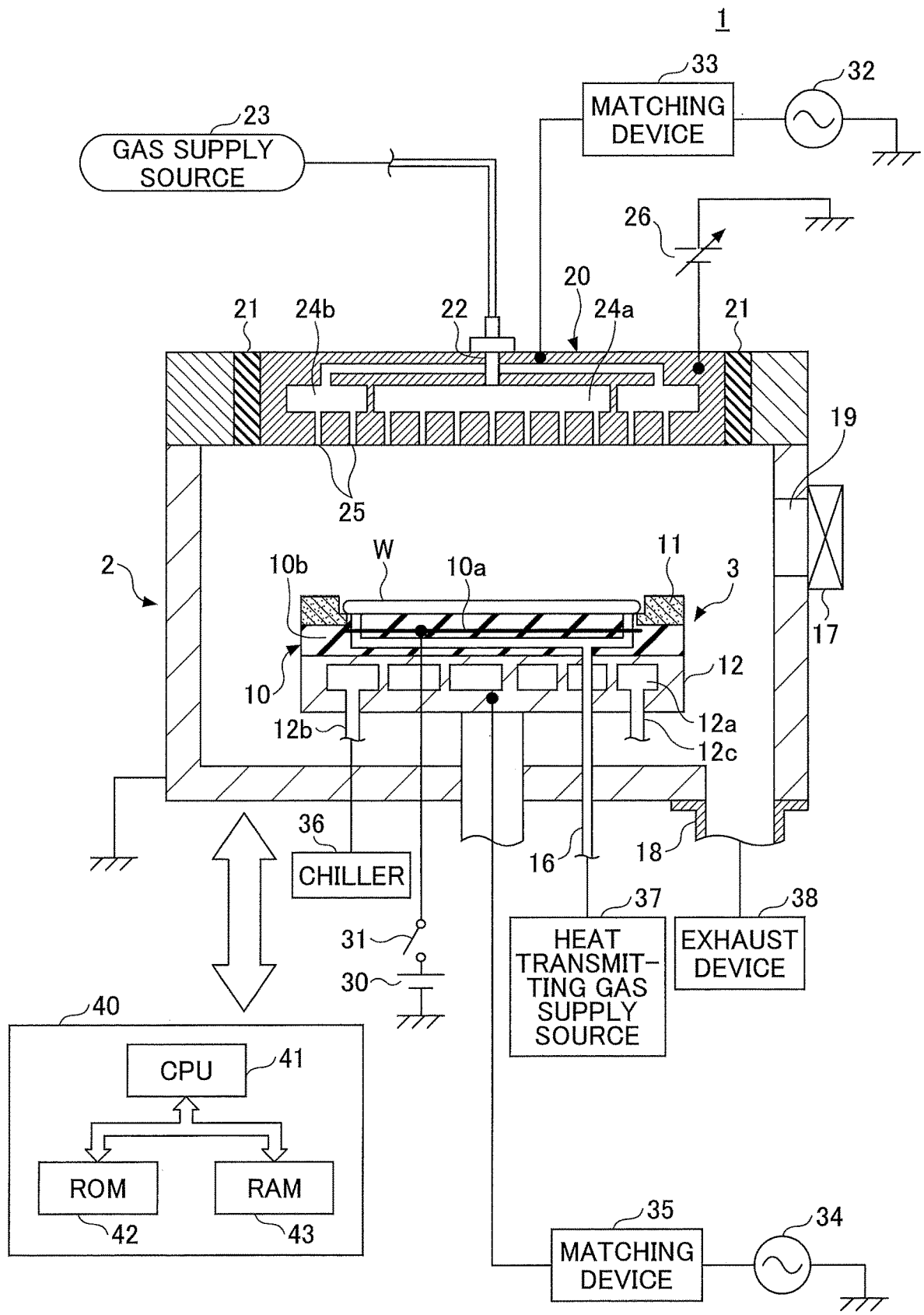
FIG. 1 is a longitudinal sectional view illustrating an example of a substrate processing apparatus according to an embodiment.

First, an example of a substrate processing apparatus 1 will be described with reference to FIG. 1. The substrate processing apparatus 1 according to a present embodiment is a capacitively coupled plasma type parallel-flat plate substrate processing apparatus, and includes a substantially cylindrical processing vessel 2. Inside the processing vessel 2 is a process chamber in which a plasma process, such as an etching process or a film deposition process, is performed by a plasma. To an internal surface of the processing vessel 2, anodic oxidation treatment is applied.

A stage 3 is provided inside the processing vessel 2, to mount a wafer W, which is an example of a substrate. The stage 3 is formed of, for example, aluminum (Al), titanium (Ti), silicon carbide (SiC), or the like. The stage 3 is fixed at a bottom of the processing vessel 2, and also functions as a bottom electrode.

The stage 3 includes a base 12 and an electrostatic chuck 10 on the base 12. The electrostatic chuck 10 is configured such that a chuck electrode 10*a* is embedded in an insulator 10*b*. A direct current (DC) power supply 30 is connected to the chuck electrode 10*a* via a switch 31. When the switch 31 is turned on, DC voltage is applied from the DC power source 30 to the chuck electrode 10*a*. When the switch 31 is turned off, applying of DC voltage to the chuck electrode 10*a* is stopped. When DC voltage is applied to the chuck electrode 10*a*, the wafer W is attracted to the electrostatic chuck 10 by Coulomb force.

An edge ring 11 (may also be referred to as a "focus ring") is circular, and is provided around the wafer W on an outer periphery of the electrostatic chuck 10. The edge ring 11 is formed of silicon for example, and functions to improve efficiency of a plasma process by making the plasma converge above the wafer W.

A coolant passage 12a is formed within the base 12. For example, a cooling medium (hereinafter, referred to as "coolant") such as cooling water or brine is output from a chiller 36, flows from a coolant inlet pipe 12b to a coolant outlet pipe 12c through the coolant passage 12a, and returns to the chiller 36. As a result, heat is released from the stage 3, and the stage 3 is cooled.

A heat transmitting gas supply source 37 supplies heat transmitting gas, such as helium gas (He), between a surface of the electrostatic chuck 10 and a back surface of the wafer W through a heat transmitting gas supply line 16. A temperature of the electrostatic chuck 10 is controlled by the coolant circulating in the coolant passage 12a and the heat transmitting gas supplied to the back surface of the wafer W. As a result, the wafer W can be maintained in a predetermined temperature.

A high frequency power supply 34 (may also be referred to as a radio frequency power supply 34) is connected to the stage 3 via a matching device 35 to apply, to the stage 3, radio frequency electric power LF of a second frequency for generating bias voltage. The second frequency may be, for example, 13.56 MHz. The matching device 35 causes a load impedance to match internal impedance (output impedance) of the radio frequency power supply 34.

A showerhead 20 is mounted to occlude an opening in the ceiling of the processing vessel 2 via a shield ring 21 covering its outer edge. The showerhead 20 may be formed of silicon. A high frequency power supply 32 (may also be referred to as a radio frequency power supply 32) is connected to the showerhead 20 via a matching device 33, to apply, to the showerhead 20, radio frequency electric power HF for plasma generation of a first frequency higher than the second frequency. The first frequency may be, for example, 60 MHz. The radio frequency power HF may also be applied to the stage 3.

A variable DC power supply 26 is connected to the showerhead 20, and applies negative DC voltage to the showerhead 20. The showerhead 20 also functions as a counter-electrode (upper electrode) facing the stage 3 (lower electrode). The matching device 33 caused a load impedance to match an internal impedance (or output impedance) of the high frequency power supply 32.

A gas supply source 23 supplies gas used for a plasma process to a diffusion chamber 24a in a center of the showerhead 20 and a diffusion chamber 24b on an outer side of the showerhead 20, through a gas inlet 22. The gas diffused inside the diffusion chamber 24a on the center side and the diffusion chamber 24b on the outer side is introduced into the stage 3 from gas supply holes 25.

An exhaust port 18 is formed at a bottom of the processing vessel 2. An exhaust device 38 is connected to the exhaust port 18, and evacuates an interior of the processing vessel 2. This maintains the inside of the processing vessel 2 at a predetermined quality of vacuum. A gate valve 17 opens and closes a conveyance port 19 at a side wall of the processing vessel 2, to load an unprocessed wafer W into the processing vessel 2, or to unload the wafer W from the processing vessel 2.

A controller 40 controls an entire operation of the substrate processing apparatus 1. The controller 40 includes a CPU 41, a ROM 42, and a RAM 43. The CPU 41 controls a plasma process, such as etching and deposition, using plasma according to a recipe stored in the ROM 42 or the RAM 43. The recipe includes control information of the substrate processing apparatus 1 for a certain process condition, such as a process time, pressure (gas exhaust), magnitude of radio frequency electric power or voltage, flow rates of various gases, a temperature inside the processing vessel 2 (upper electrode temperature, side wall temperature of the processing vessel, wafer W temperature, electrostatic chuck temperature, etc.), and a coolant temperature. The recipe may be stored in a hard disk drive or a semiconductor memory. Alternatively, the recipe may be recorded in a removable storage medium such as a CD-ROM or a DVD, and the removable storage medium may be loaded in a predetermined place in an accessible state.

In performing a plasma process, the controller 40 opens the gate valve 17, loads the wafer W through the conveyance port 19, and mounts the wafer W on the stage 3. The controller 40 causes DC voltage of positive or negative polarity to be applied to the chuck electrode 10a, so that the wafer W is attracted to the electrostatic chuck 10.

The controller 40 supplies a desired gas from the gas supply source 23 into the processing vessel 2, causes radio frequency electric power HF and negative DC voltage to be applied to the showerhead 20, and causes high frequency electric power LF to be applied to the stage 3. By the above-described operation being performed, the gas is dissociated and a plasma is generated above the wafer W. By an effect of the plasma, the wafer W is plasma processed.

After the plasma process, by control of the controller 40, DC voltage having an opposite polarity to the polarity when the wafer W is attracted is applied to the chuck electrode 10a, to remove electric charge on the wafer W. After the removal of the electric charge, the controller 40 causes the wafer W to be removed from the electrostatic chuck 10, opens the gate valve 17, and unloads the wafer W from the conveyance port 19 to an outside of the processing vessel 2.

Die Shrink

As die shrink progresses, wiring resistance or contact resistance increases. Thus, because variation in wiring resistance or contact resistance tends to affect variation in device performance, suppressing variation in wiring resistance or contact resistance has become important.

Accordingly, in a substrate processing method according to one embodiment to be described below, local critical dimension uniformity (hereinafter, may also be referred to as "L-CDU") of a contact hole pattern is improved. The L-CDU represents variation in critical dimension (CD) of adjacent contact holes. Examples of measures indicating pattern variation in line patterns include LWR (line width roughness) and LER (line edge roughness).

Board Processing Process

Figure 2B:
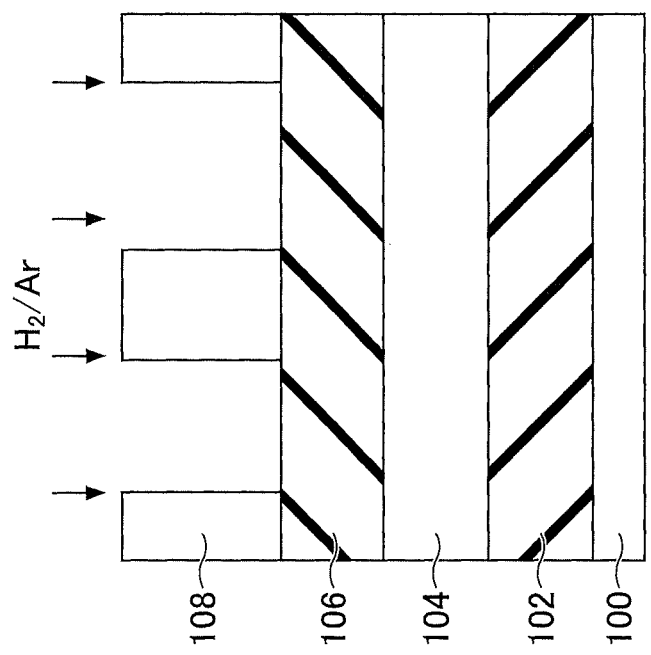
Figure 2A:
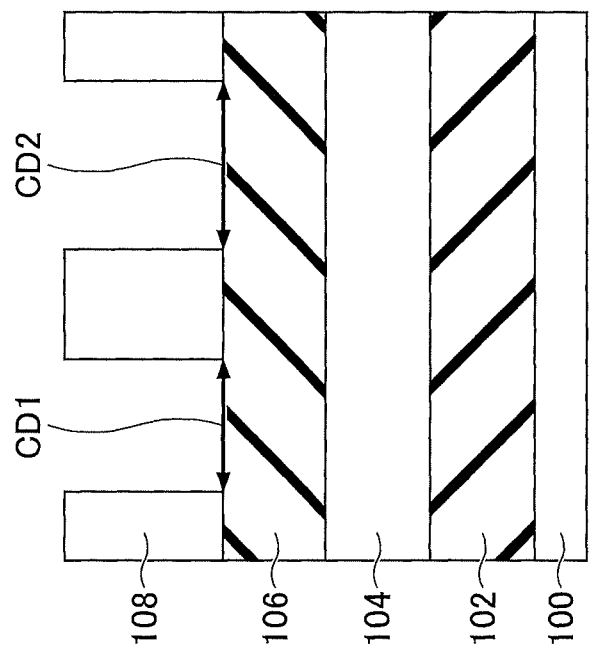
Figure 2D:
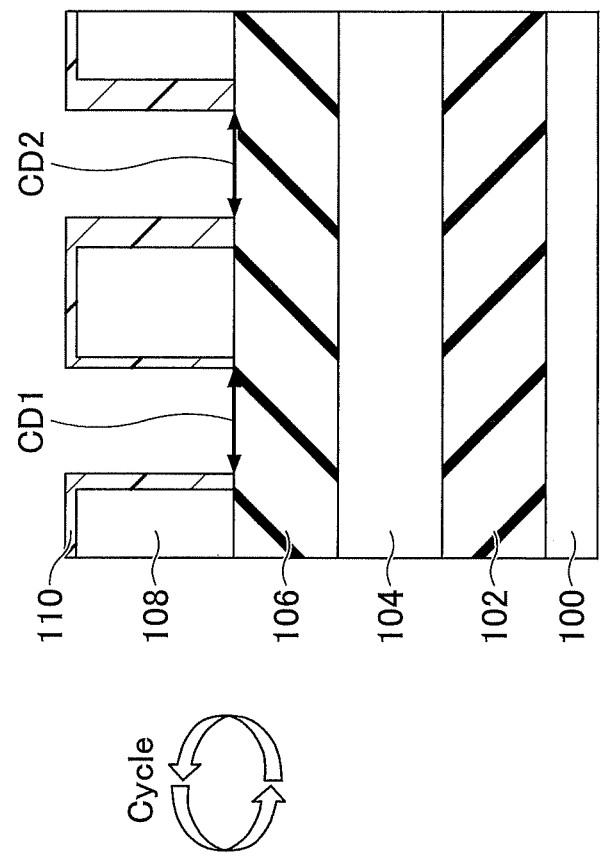
Figure 2C:
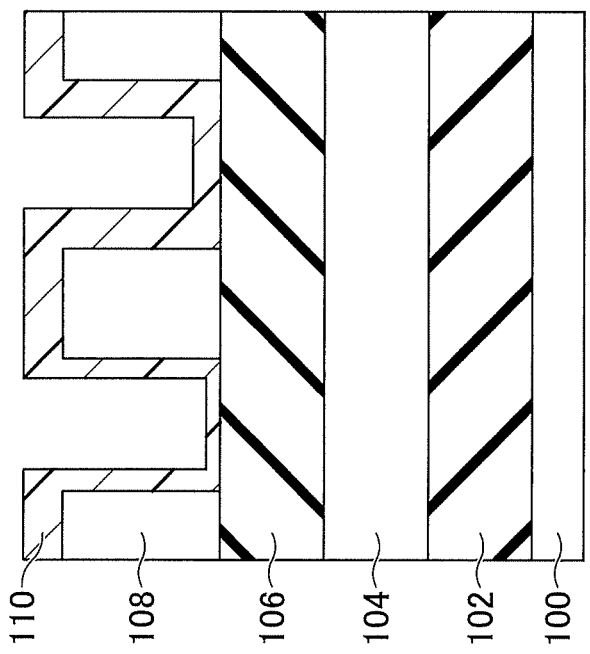
Figure 3:
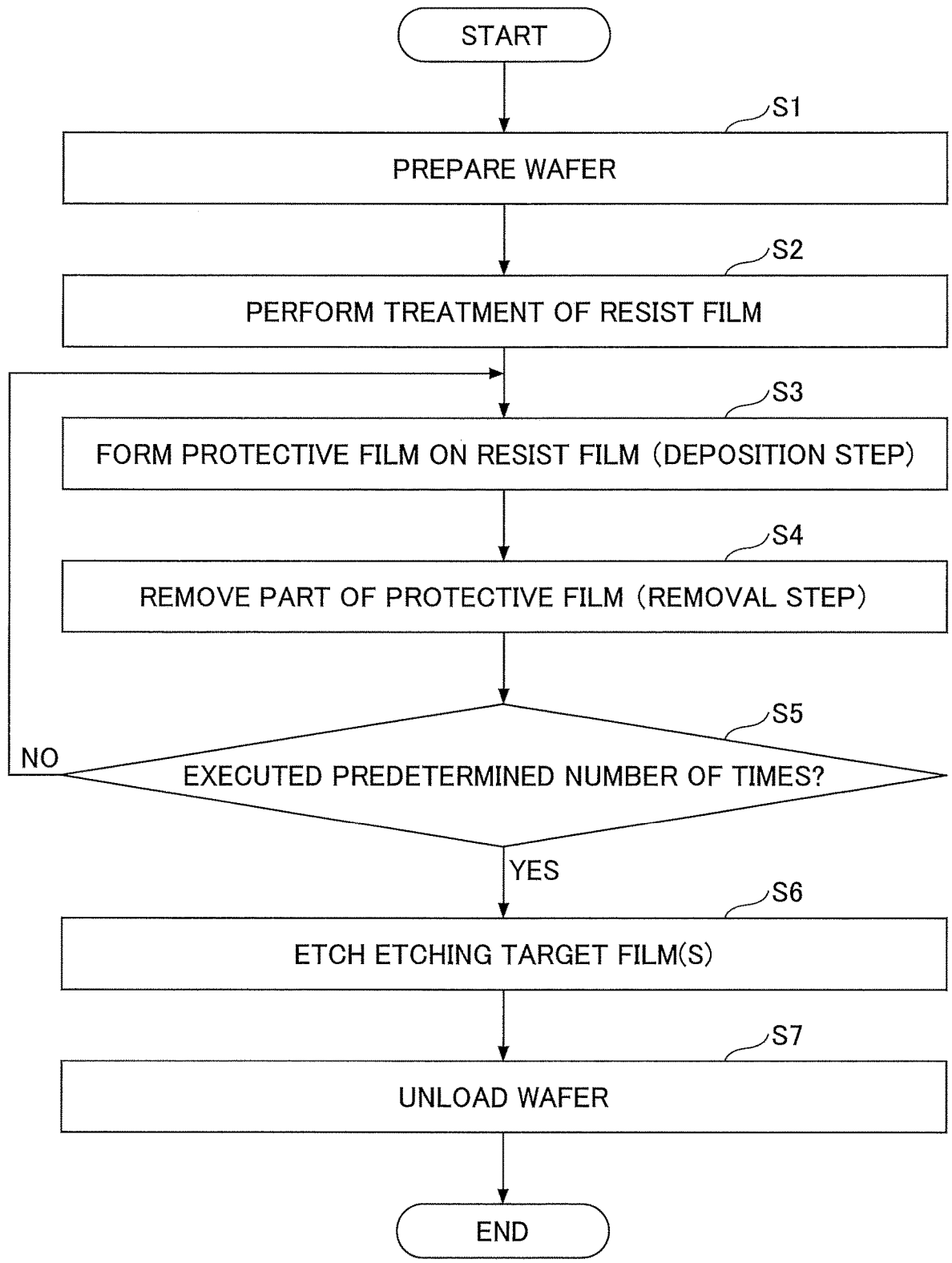
FIG. 3 is a flowchart illustrating an example of the substrate processing method according to the embodiment.

Referring to FIGS. 2A to 2F and FIG. 3, an example of a substrate processing method according to the present embodiment will be described. FIG. 2 illustrates an example of a substrate processing step according to an embodiment. FIG. 3 is a flowchart illustrating an example of a method of processing a substrate according to an embodiment. The processing of each step illustrated in FIG. 3 is controlled by the controller 40.

Initial State

FIG. 2A illustrates layered films on the wafer W in an initial state (the initial state refers to a state of the wafer W before the method of processing a substrate to be described below with reference to FIG. 3 is started, more specifically, a state before a cycle step to be described below is executed). The wafer W includes a silicon oxide film 102, an SOC (Spin On Carbon) film 104, an SOG (Spin On Glass) film 106, and a resist film 108, which are sequentially stacked on a silicon substrate 100.

The resist film 108 is an organic film having a pattern of contact holes (hereinafter, also may be referred to as a "mask pattern") formed thereon, and functions as a patterned mask layer. The SOG film 106, the SOC film 104, and the silicon oxide film 102 are examples of films to be etched (may also be referred to as "etching target films").

In step S1 of FIG. 3, the controller 40 first prepares the wafer W in the shape of FIG. 2A.

Treatment Step

Next, in step S2, the controller 40 performs treatment of the resist film 108 with an $H_2$ gas plasma or an HBr gas plasma. FIG. 2B illustrates an example of supplying $H_2$ and Ar gases. This allows a surface of the resist film 108 to be treated to improve a pattern shape. However, step S2 may be omitted.

Cycle of Deposition Step and Removal Step

Referring back to FIG. 3, the controller 40 then performs at least one set of a deposition step and a removal step, to make a CD size of the mask pattern of the resist film 108 uniform. In the present embodiment, the set of the deposition step and the removal step may be referred to as a "cycle step". In step S3, the controller 40 deposits deposits (deposition step) on an upper surface and side surface of the resist film 108, and on a bottom surface of the resist film 108 (upper surface of the SOG film 106), to increase a taper angle on the side surface of the mask pattern of the resist film 108. Definition of the taper angle is illustrated in FIG. 5B. The taper angle is an angle formed by a tangent to the side surface of the mask pattern and a tangent to the bottom surface of the mask pattern (θ in FIG. 5B). As a result, a protective film 110 of an organic film is formed on the upper surface, the side surface, and the bottom surface of the resist film 108, as illustrated in FIG. 2C.

Next, in step S4 of FIG. 3, the controller 40 removes a portion of the protective film 110 that is deposited in the deposition step, by trimming the protective film 110 (the removal step), to reduce the taper angle of the side surface of the mask pattern of the resist film 108 (with respect to the taper angle, see FIG. 5B).

The controller 40 repeats the above cycle step one or more times to control the taper angle of the side surface of the mask pattern of the resist film 108 to a desired angle, to eliminate variation in CD size. As a result, as illustrated in FIG. 2D, the CD sizes (such as CD1 and CD2 in FIG. 2D) in the mask pattern of the resist film 108 can become uniform, by the protective film 110 that remains mainly on the side surface of the resist film 108. The deposition step corresponds to a first step of depositing deposits on the mask layer. The removal step corresponds to a second step of removing at least either one of a portion of the mask layer and a portion of the deposits. It should be noted that either the first step may be performed first or the second step may be performed first.

Next, in step S5 of FIG. 3, the controller 40 determines whether or not the above-mentioned cycle step has been repeated a predetermined number of times. In the following, the number of times that the cycle step is performed repeatedly may also be referred to as a "cycle count".

Next, if it is determined that the cycle step has not been repeated the predetermined number of times, the controller 40 repeats execution of steps S3 to S5. This controls the taper angle of the side surface of the mask pattern of the resist film 108 to a desired angle. The predetermined number of times is a value greater than zero.

Etching Step

If it is determined in step S5 that the predetermined number of the cycle steps has been executed repeatedly, the controller 40 etches the SOG film 106 in step S6. As a result, as illustrated in FIG. 2E, the SOG film 106 is etched into the mask pattern of the resist film 108, and contact holes each having a uniform CD size (e.g., CD1, CD2) are formed. In step S6, the controller 40 further etches the SOC film 104 and the silicon oxide film 102 in that order. Thus, as illustrated in FIG. 2F, contact holes each having a uniform CD size are formed in the silicon oxide film 102. Next, in step S7 of FIG. 3, the controller 40 unloads the wafer W out of the processing vessel 2, and terminates the process.

The wafer W unloaded from the processing vessel 2 is transported to an ashing device or a wet cleaning device, and the SOC film 104 on the silicon oxide film 102 or a residue on the wafer W is removed, but is not limited thereto. For example, after the end of step S6 and during step S7, the controller 40 may perform a step of removing the SOC film 104 by ashing.

Process Condition

Process conditions of each of the steps in the above-described substrate processing method will be described.

Treatment Step

First, the process condition of the treatment step in step S2 of FIG. 3 is as follows.

Type of gas: $H_2$ gas, Ar gas

However, types of gas used in the treatment step are not limited to the above-mentioned gases. For example, HBr gas or Ar gas may be supplied.

Deposition Step

Next, the process condition of the deposition step of step S3 is as follows.

Type of gas: $CH_4$ gas, $H_2$ gas, Ar gas

However, types of gas used in the deposition step are not limited to the above-mentioned gases. For example, instead of the $CH_4$ gas, a gas containing at least one of other hydrocarbon (CH) gases, a hydrofluorocarbon (CHF) gas, and a fluorocarbon (CF) gas may be used. In the following, a gas used in the deposition step may be referred to as a first gas. In the deposition step, a plasma process is performed using the first gas. The first gas does not necessarily contain $H_2$ gas. Alternatively, $N_2$ gas or other inert gas may be used instead of Ar gas.

Removal Step

Next, the process condition of the removal step of step S4 is as follows.

Gas type: $CO_2$ gas, $CH_4$ gas

However, types of gas used in the removal step are not limited to the above-described gases. For example, $O_2$ gas, CO gas, N$_2$ gas, or H$_2$ gas may be used instead of CO$_2$ gas. Also, instead of CH$_4$ gas, other hydrocarbon (CH) gas, hydrofluorocarbon (CHF) gas, or fluorocarbon (CF) gas may be used.

Etching Step

Next, the process conditions of the etching step of step S6 is as follows.

Type of gas: CHF$_3$ gas and CF$_4$ gas

However, types of gas used in the etching step are not limited to the above-described gases.

Cycle Count

In the deposition step, deposits are caused to adhere to the side surface of the contact hole. At this time, the deposits tend to adhere more to a larger hole than to a smaller hole (loading effect). In the present embodiment, this loading effect of deposits is utilized.

In the removal step, deposits that have adhered to the side surface of the contact holes during the deposition step are removed evenly. By repeating the set of the deposition step and the removal step, the CD size of each of the contact holes can become uniform, and L-CDU improves.

Figure 4A:
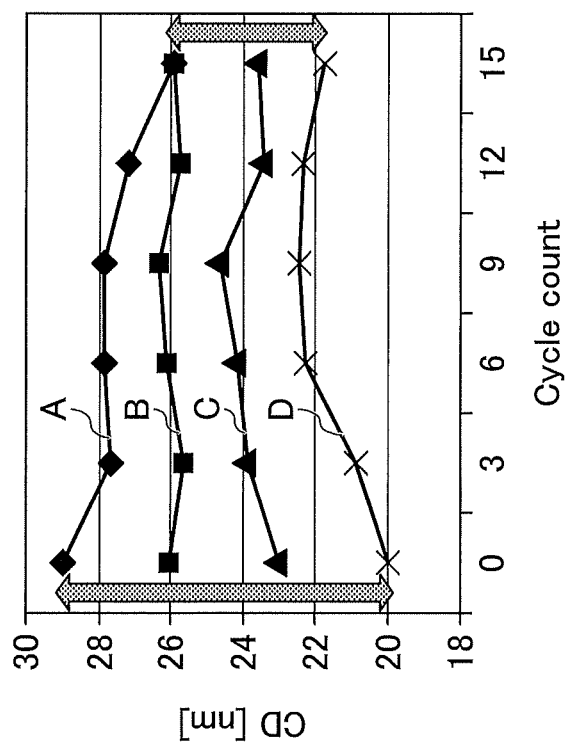
FIGS. 4A and 4B are graphs each illustrating experimental results of observing a relationship between a cycle count and variation in a pattern.
Figure 4B:
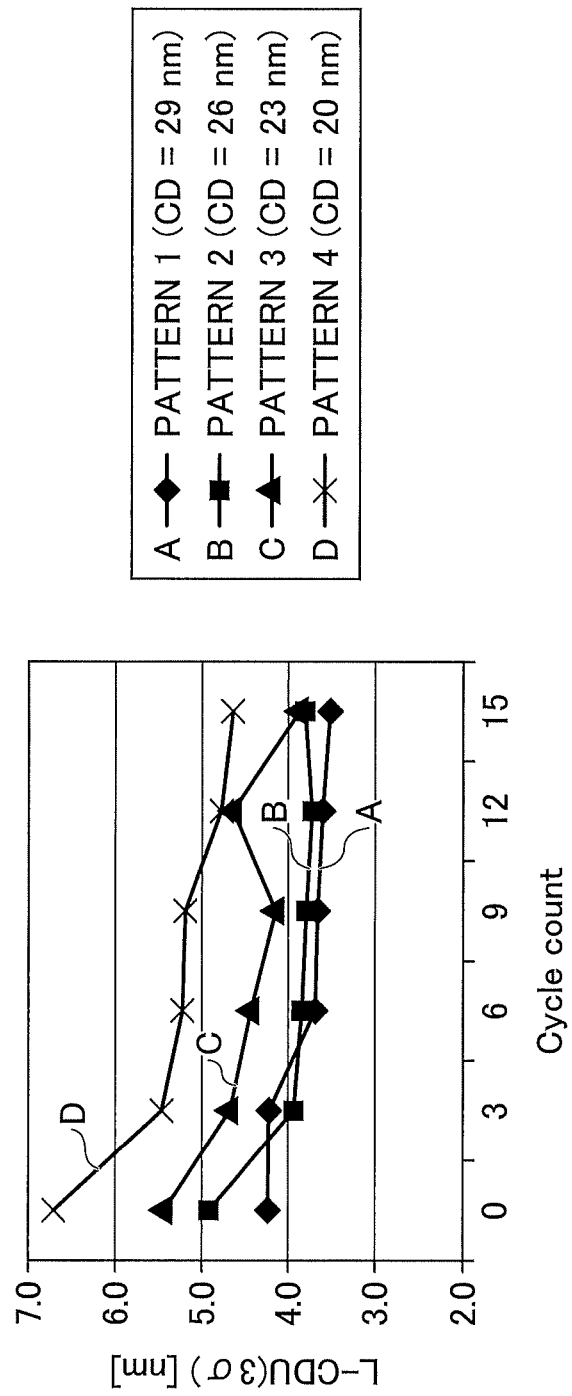

FIGS. 4A and 4B are graphs illustrating examples of results of an experiment observing a relationship between a cycle count and variation in the mask pattern when the set of the deposition step and the removal step are repeated. In this experiment, CD values and L-CDU were measured for four mask patterns (patterns 1 to 4). The horizontal axes of the graphs in FIGS. 4A and 4B indicate the cycle count, and the vertical axes in FIGS. 4A and 4B indicate a CD value and L-CDU (3σ), respectively (note: a denotes a standard deviation).

As illustrated in FIG. 4A, in an initial state (before executing cycle step(s)), the maximum difference in the CD values of pattern 1 (illustrated as a curve A in FIGS. 4A and 4B) (CD=29 nm), pattern 2 (illustrated as a curve B in FIGS. 4A and 4B) (CD=26 nm), pattern 3 (illustrated as a curve C in FIGS. 4A and 4B) (CD=23 nm), and pattern 4 (illustrated as a curve D in FIGS. 4A and 4B) (CD=20 nm) was 9 nm (=29 nm−20 nm).

As the cycle steps were repeated and the cycle count increased, the maximum difference in the CD value decreased, as illustrated in FIG. 4A. When the cycle count was 15, the maximum difference in the CD value became 4 nm (=26 nm−22 nm). Similarly, as illustrated in FIG. 4B, as the cycle count increased, L-CDU (3σ) decreased in each of the patterns 1 to 4, and L-CDU (3σ) became smallest when the cycle count was 15.

Taper Angle

As illustrated in the middle of FIG. 5B, the taper angle is defined as 90° when the side surface of the mask pattern is vertical. The taper angle when the mask pattern becomes in an inverted tapered shape is defined as greater than 90°. The taper angle when the mask pattern becomes in a tapered shape is defined as less than 90°.

Figure 5A:
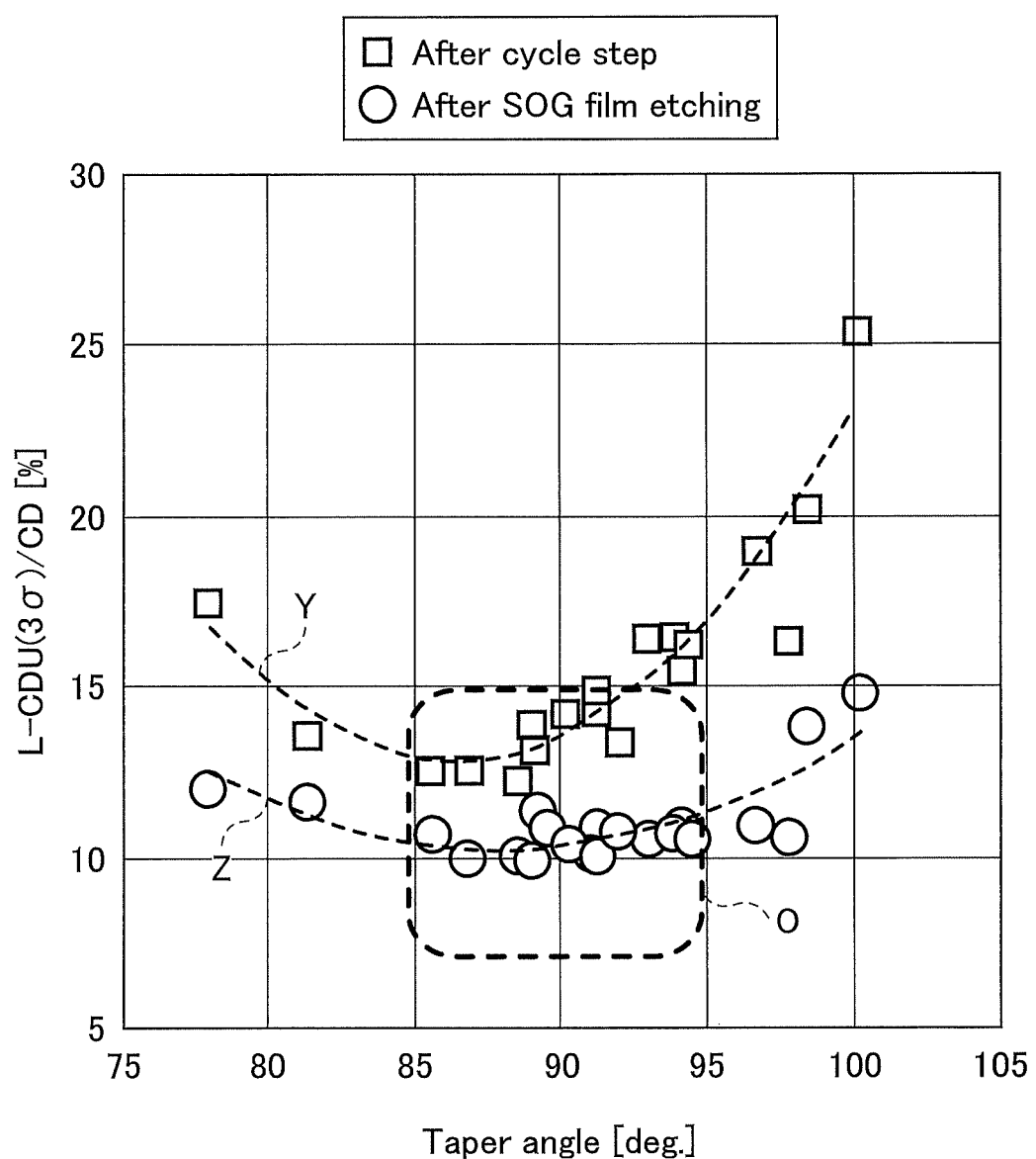
FIG. 5A is a graph illustrating an experimental result of observing a relationship between a taper angle of a pattern and variation in the pattern.

A graph in FIG. 5A illustrates an example of an experimental result of observing a relationship between a taper angle of a mask pattern and variation in the mask pattern. The horizontal axis indicates a taper angle of a mask pattern, and the vertical axis indicates variation in the mask pattern (L-CDU(3σ)/CD). The L-CDU(3σ)/CD represents L-CDU (3σ) per unit length. In the present embodiment, 3σ (3 sigma) was used for evaluating L-CDU, but is not limited.

A curve Y in FIG. 5A represents a relationship between the taper angle and L-CDU(3σ)/CD after cycle step(s). A curve Z in FIG. 5A represents a relationship between the taper angle and L-CDU(3σ)/CD after the etching of the SOG film 106. In both cases, it can be seen that variation in the pattern of the mask pattern and in the patterns the SOG film 106 decreases by adjusting the taper angle of the mask pattern to a range between 85° and 95°.

In order to reduce L-CDU(3σ)/CD, it is desirable to adjust the taper angle of the mask pattern to 85° to 90° after the cycle step(s) (see the area in the rounded corner rectangle (labeled as "O") in FIG. 5A).

Figure 6A:
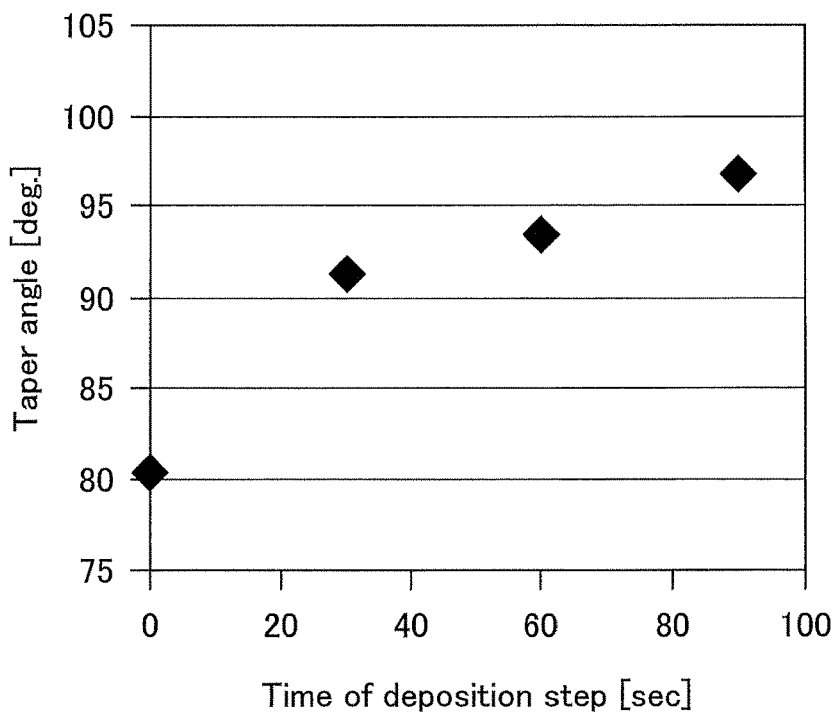
FIG. 6A is a graph illustrating an experimental result of observing a relationship between the taper angle and a time for a deposition step.
Figure 6B:
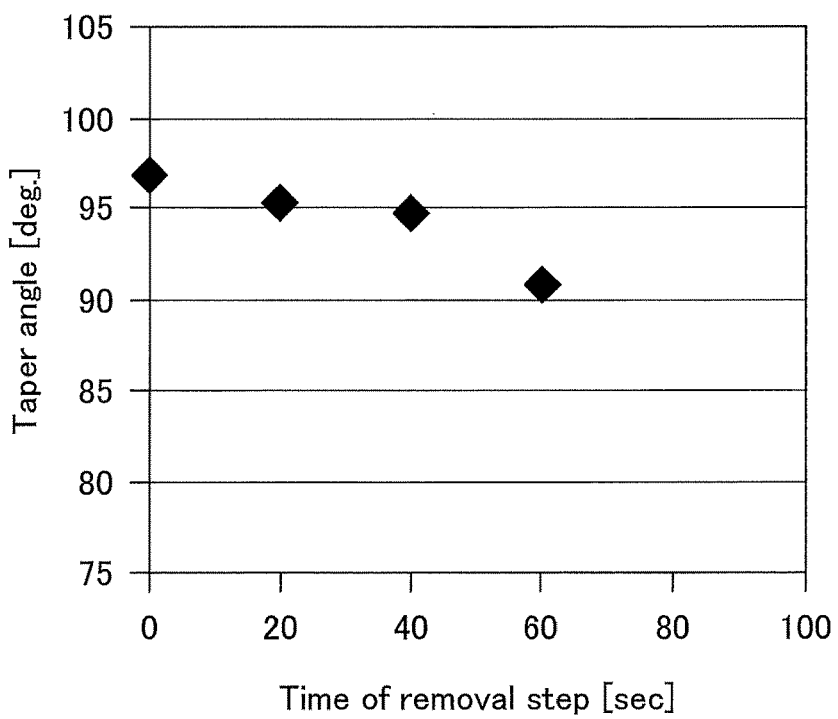
FIG. 6B is a graph illustrating an experimental result of observing a relationship between the taper angle and a time for a removal step.

FIGS. 6A and 6B are an example of experimental results of observing dependence of a taper angle on a time for the deposition step and a time for the removal step according to the embodiment. According to the result of the experiment in FIG. 6A, it was found that deposits tend to adhere to a upper portion of the mask pattern in the deposition step, that the taper angle increases as the time for the deposition step increases, and that the mask pattern becomes in an inverted tapered shape having the taper angle greater than 90°.

In addition, from the experimental result in FIG. 6B, it was found that an upper portion of the protective film 110 of the mask pattern tends to be removed in the removal step, that the taper angle decreases as the time for the removal step increases, and that the mask pattern becomes in a tapered shape having the taper angle smaller than 90°.

As described above, in the deposition step, deposits can be deposited on the side surface of the contact hole to increase the taper angle. Also, in the removal step, a portion of the deposits on the side surface of the contact hole can be removed to reduce the taper angle. Thus, the taper angle of the mask pattern can be controlled by repeating the deposition and removal steps. In addition, by controlling the number of cycles (cycle count) in which the deposition and removal steps are repeated, time for the deposition and removal steps can be controlled, thereby improving L-CDU by adjusting the taper angle to a range between 85° and 95°.

That is, by repeating the deposition step and the removal step, the controller 40 controls a processing time of the cycle step, and can adjust a shape of the mask such that the taper angle after the cycle step(s) becomes 85° to 95°. This can improve L-CDU. By performing the process of eliminating variation in the CD size of the resist film 108 as described above, variation in the CD size when etching the SOG film 106 can be suppressed. Further, it is possible to suppress the CD size variation when etching the SOC film 104 and the silicon oxide film 102 sequentially by using the SOG film 106 as a mask. This allows an etched shape in the silicon oxide film 102 to be vertical while eliminating variation in CD of the etched shape, thereby improving device performance.

Gas Dependence

Figure 7:
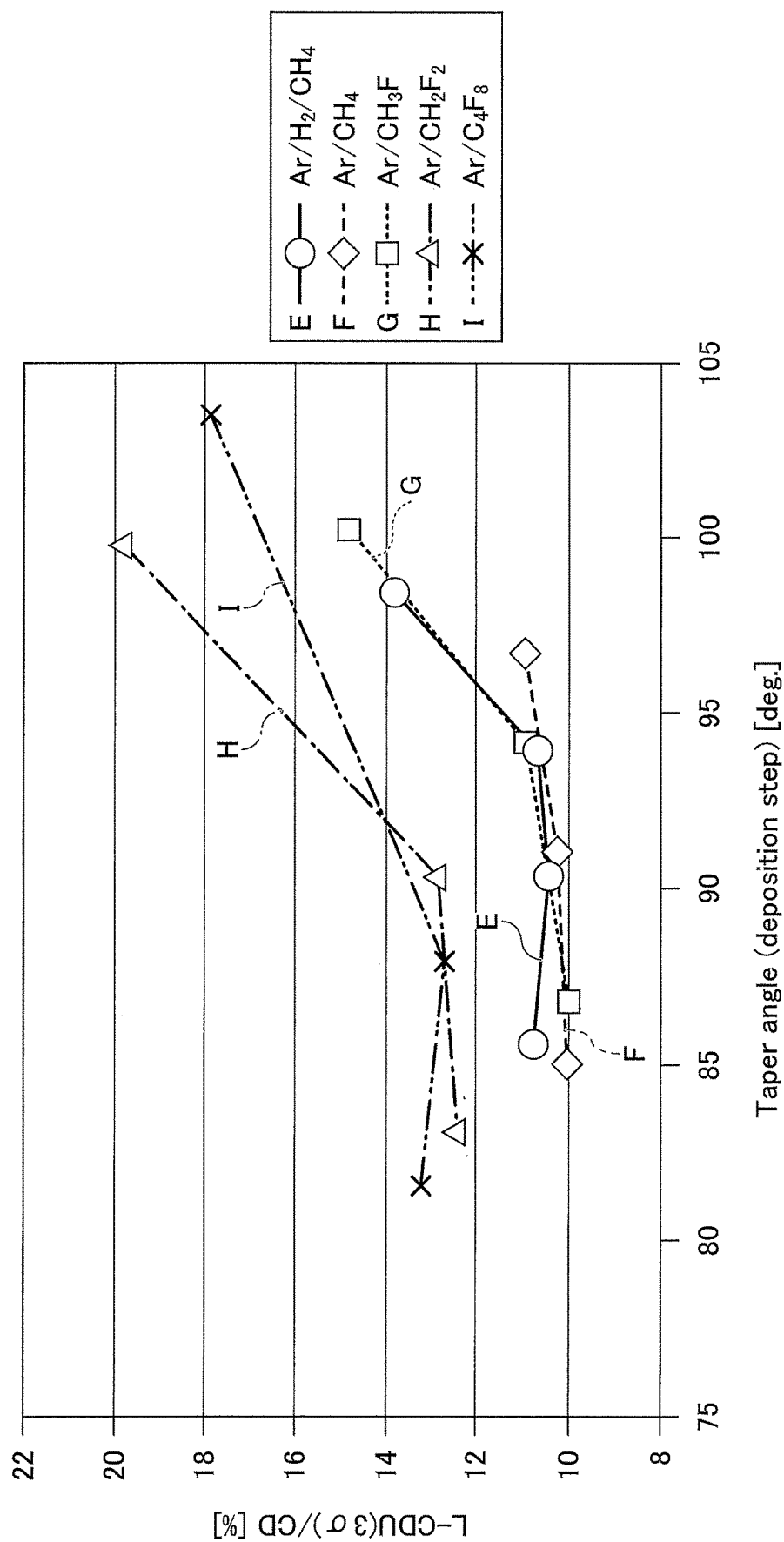
FIG. 7 is a graph illustrating a result of an experiment observing gas dependence of the deposition step according to the embodiment.
Figure 8:
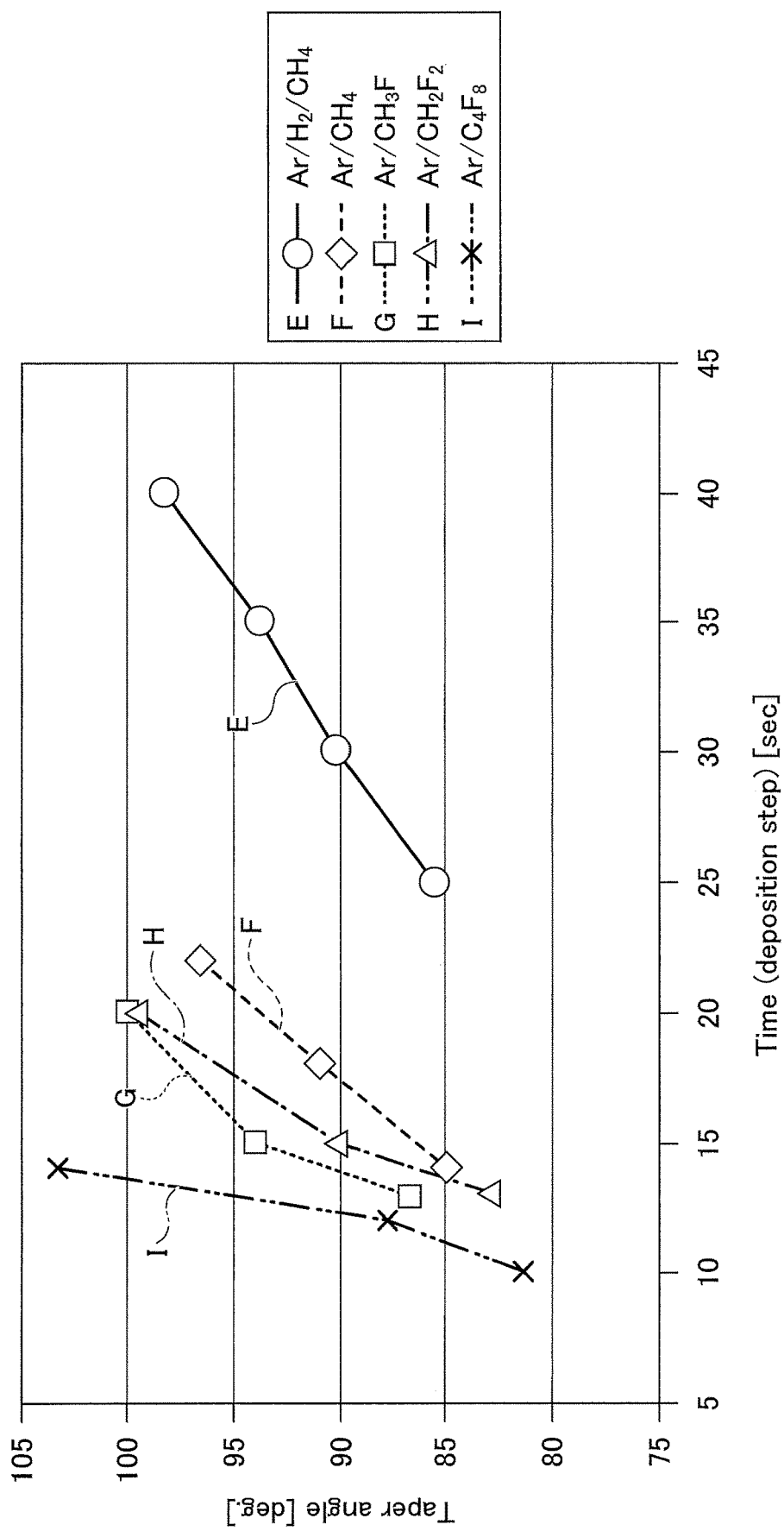
FIG. 8 is a graph illustrating a result of another experiment observing gas dependence of the deposition step according to the embodiment.

Next, the gas dependence of the deposition step will be described with reference to FIGS. 7 and 8. FIGS. 7 and 8 illustrate examples of results of experiments observing gas dependence of the deposition step according to the embodiment.

A curve E of the graph of FIG. 7 indicates a relationship between L-CDU(3σ)/CD and the taper angle after the deposition step, when Ar, H$_2$, and CH$_4$ gases were used in the deposition step. A curve F indicates a relationship between L-CDU(3σ)/CD and the taper angle after the deposition step, when Ar gas and CH$_4$ gas were used in the deposition step. A curve G indicates a relationship between L-CDU(3σ)/CD and the taper angle after the deposition step, when Ar gas and CH$_3$F gas were used in the deposition step. A curve H indicates a relationship between L-CDU(3σ)/CD and the taper angle after the deposition step, when Ar gas and CH$_2$F$_2$ gas were used in the deposition step. A curve I indicates a relationship between L-CDU(3σ)/CD and the taper angle after the deposition step, when Ar gas and C$_4$F$_8$ gas were used in the deposition step.

According to the result in FIG. 7, any of the gases illustrated in the curves E to I could reduce L-CDU(3σ)/CD by adjusting the taper angle to a range between 85° and 95°. That is, it was found that L-CDU can be improved, if the taper angle is adjusted to 85° to 95° by the plasma process using the first gas containing at least one of hydrocarbon (CH) gas, hydrofluorocarbon (CHF) gas, and fluorocarbon (CF) gas in the deposition step.

A graph in FIG. 8 illustrates an example of result of experiments observing a relationship between a taper angle and a time for the deposition step (may also be referred to as a deposition time). Similar to FIG. 7, a curve E in FIG. 8 indicates an experimental result when Ar, H$_2$, and CH$_4$ gases were used in the deposition step. A curve F in FIG. 8 indicates an experimental result when Ar gas and CH$_4$ gas were used in the deposition step. A curve G in FIG. 8 indicates an experimental result when Ar gas and CH$_3$F gas were used in the deposition step. A curve H in FIG. 8 indicates an experimental result when Ar gas and CH$_2$F$_2$ gas were used in the deposition step. A curve I in FIG. 8 indicates an experimental result when Ar gas and C$_4$F$_8$ gas in the deposition step. According to the experimental results in FIG. 8, it was found that any of the gases illustrated in the curves E to I can be used to control the taper angle, by controlling the deposition time. That is, it was found that in the deposition step in which the plasma process using the first gas is performed, the taper angle can be controlled by the number of cycles (cycle count) to control the deposition time.

In particular, a set of Ar gas, H$_2$ gas, and CH$_4$ gas used in the experiment corresponding to the curve E, a set of Ar gas and CH$_4$ gas used in the experiment corresponding to the curve F, and a set of Ar gas and CH$_3$F gas used in the experiment corresponding to the curve G, could reduce L-CDU(3σ)/CD as compared to a set of Ar gas and CH$_2$F$_2$ gas used in the experiment corresponding to the curve H, or a set of Ar gas and C$_4$F$_8$ gas used in the experiment corresponding to the curve I. According to the above-described results, it was found that an amount of H atoms in the first gas used in the deposition step is preferably greater than an amount of F atoms, and that adjusting the taper angle to a range between 85° and 95° is more preferable. For example, it has been found that CH$_4$ gas and CH$_3$F gas is more preferable for a gas used in the deposition step, as compared to CH$_2$F$_2$ or C$_4$F$_8$ gas.

Pressure Dependence

Figure 9A:
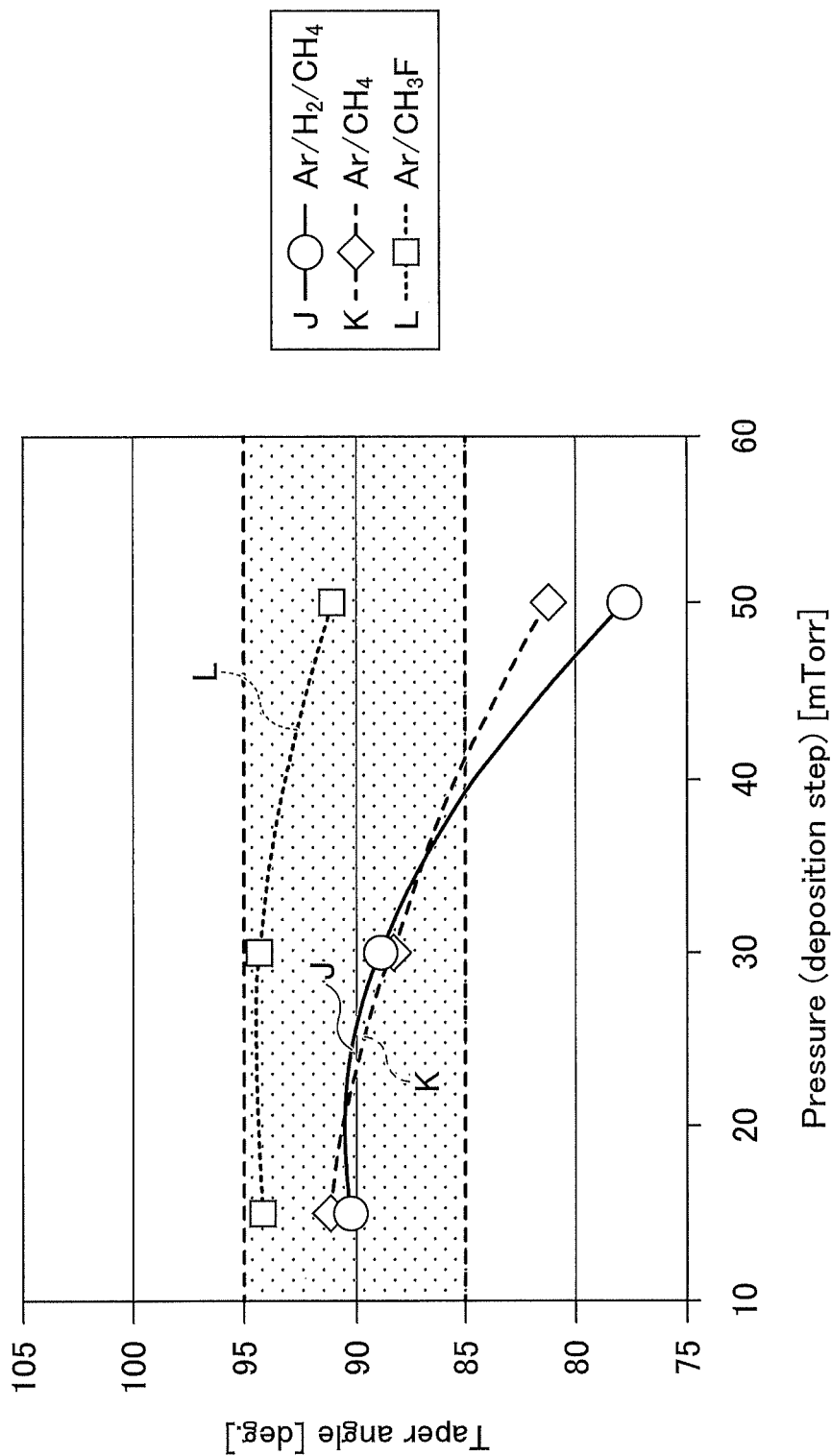
FIGS. 9A and 9B are graphs each illustrating results of experiments observing pressure dependence of the deposition step according to the embodiment.
Figure 9B:
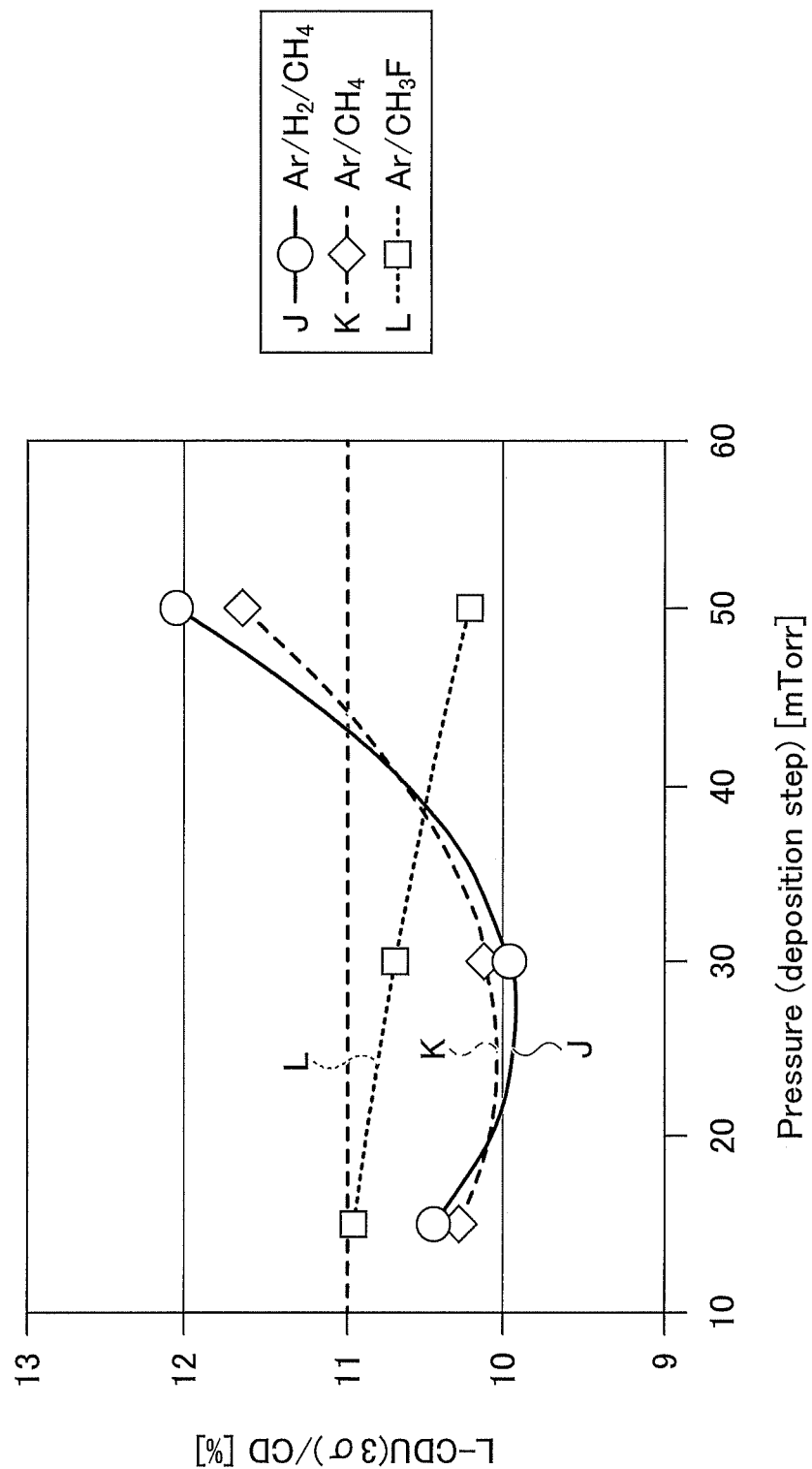

Next, pressure dependence in the deposition step will be described with reference to FIGS. 9A and 9B. FIGS. 9A and 9B are graphs each illustrating results of experiments observing pressure dependence of the deposition step according to the embodiment. The graph of FIG. 9A illustrates change in the taper angle in accordance with change in pressure in the processing vessel 2. FIG. 9B illustrates change in L-CDU(3σ)/CD in accordance with change in pressure in the processing vessel 2.

Curves J illustrated in FIGS. 9A and 9B respectively indicate the taper angle and L-CDU(3σ)/CD after the deposition step, in a case in which Ar gas, H$_2$ gas, and CH$_4$ gas are used in the deposition step. Curves K in FIGS. 9A and 9B respectively indicate the taper angle and L-CDU(3σ)/CD after the deposition step, in a case in which Ar gas and CH$_4$ gas are used in the deposition step. Curves L in FIGS. 9A and 9B respectively indicate the taper angle and L-CDU(3σ)/CD after the deposition step, in a case in which Ar gas and CH$_3$F gas are used in the deposition step.

According to the experimental results in FIGS. 9A and 9B, the taper angle and L-CDU(3σ)/CD varies in accordance with change in pressure for any of the above gases being used. In addition, under a pressure condition in which the taper angle became between 85° and 95° (this condition can be seen from FIG. 9A), L-CDU(3σ)/CD became approximately 11% or less, as illustrated in FIG. 9B. In other words, it was found that L-CDU(3σ)/CD becomes better under the pressure condition in which the taper angle becomes between 85° and 95°. However, even in a pressure condition in which the taper angle became between 85° and 95°, there may be a case in which L-CDU(3σ)/CD becomes greater than 11%. Therefore, it was found that it is preferable to control the pressure condition in which L-CDU(3σ)/CD becomes 11% or less and in which the taper angle becomes between 85° and 95°.

Temperature Dependence

Figure 10A:
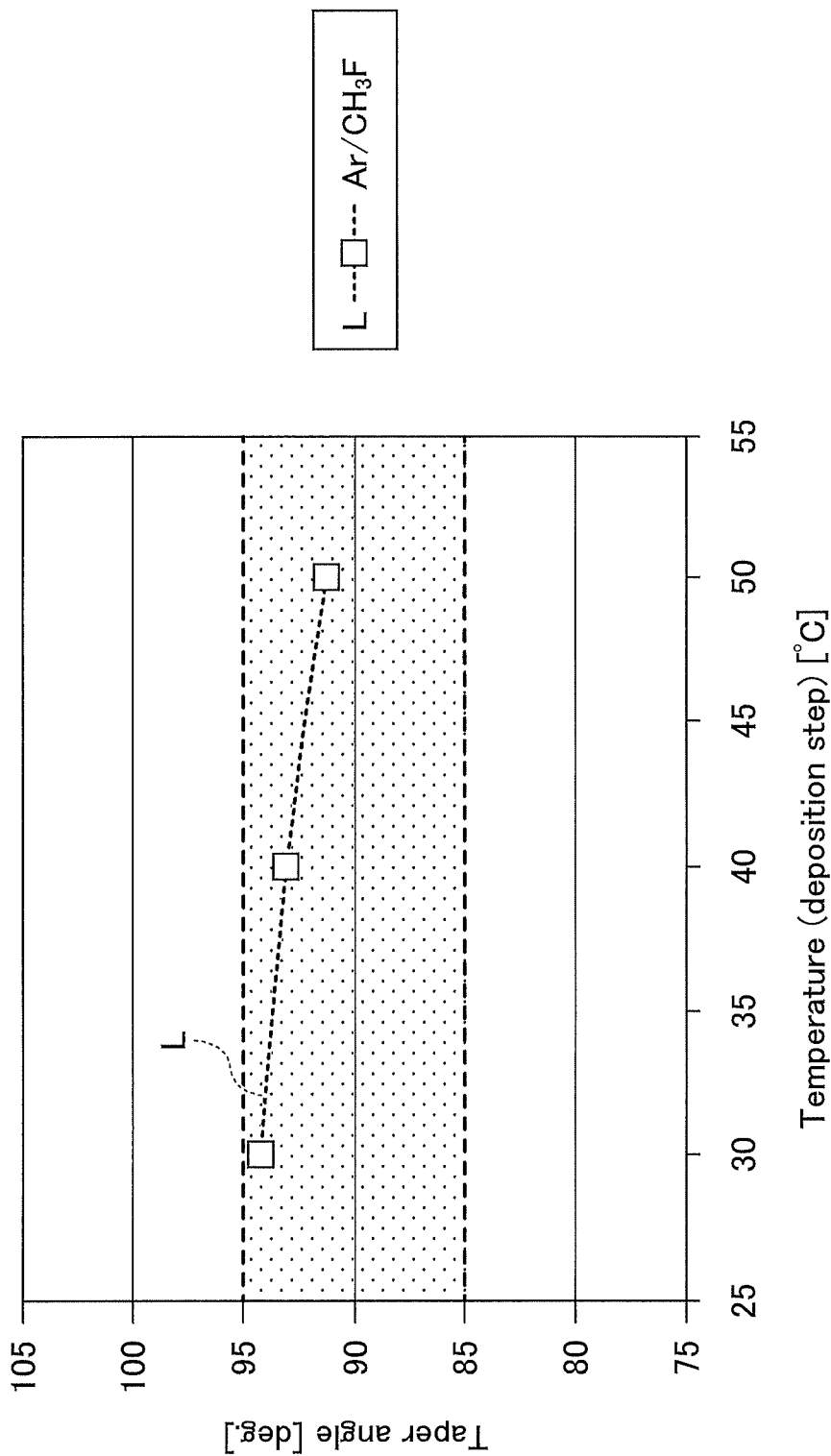
FIGS. 10A and 10B are graphs each illustrating a result of an experiment observing temperature dependence of the deposition step according to the embodiment.
Figure 10B:
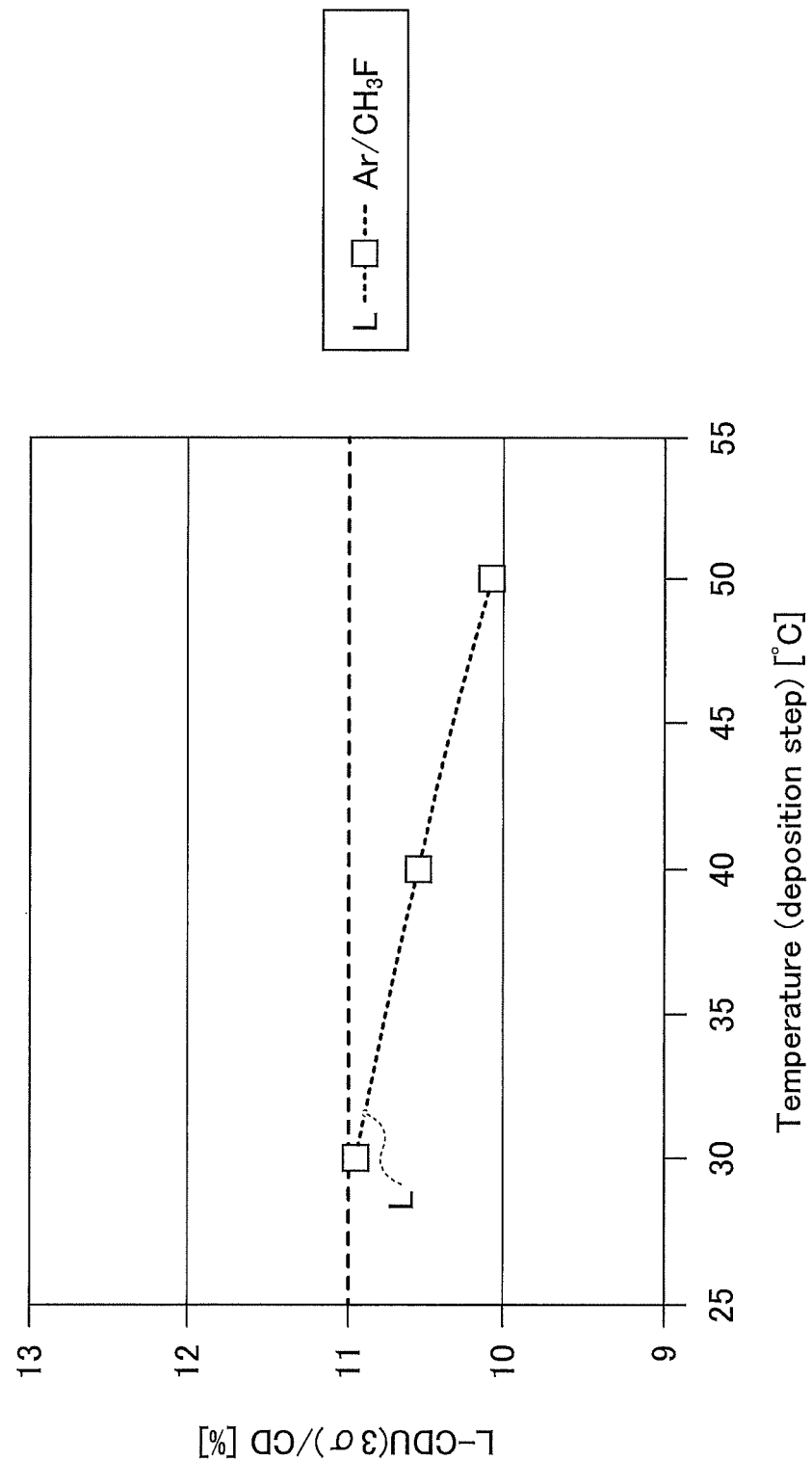

Next, temperature dependence in the deposition step will be described with reference to FIGS. 10A and 10B. FIGS. 10A and 10B are graphs each illustrating a result of an experiment observing temperature dependence of the deposition step according to the embodiment. The graph in FIG. 10A illustrates change in the taper angle in accordance with change in wafer temperature. The graph in FIG. 10B illustrates change in L-CDU(3σ)/CD in accordance with change in wafer temperature. The gas used in the experiment of FIGS. 10A and 10B is the same as the gas used in the experiment indicated by the curve L in FIG. 9A or 9B. That is, curves L illustrated in FIGS. 10A and 10B respectively indicate the taper angle and L-CDU(3σ)/CD after the deposition step, in a case in which Ar gas and CH$_3$F gas are used in the deposition step.

According to the experimental results in FIGS. 10A and 10B, it was found that the taper angle and L-CDU(3σ)/CD varies in accordance with change in temperature. In addition, under a temperature condition in which the taper angle became between 85° and 95° (illustrated in FIG. 10A), L-CDU(3σ)/CD became approximately 11% or less, as illustrated in FIG. 10B. Therefore, it was found that it is preferable to control temperature condition such that L-CDU(3σ)/CD becomes 11% or less, in the temperature condition in which the taper angle becomes between 85° and 95°. In FIGS. 9, 10A, and 10B, an allowable value (threshold) of L-CDU(3σ)/CD was 11% or less, but is not limited thereto, and other thresholds such as values greater than 11% or smaller than 11% may be used.

Adjustment of Taper Angle

Next, adjustment of the taper angle in the cycling step of the substrate processing method will be described with reference to FIGS. 11A to 11E. FIGS. 11A to 11E are diagrams explaining a method of adjusting the taper angle in the substrate processing method according to the embodiment.

Let the taper angle of the side surface of the resist film 108 in an initial state (before executing a cycle step) be $\theta_0$. In the substrate processing method according to the embodiment, the deposition step and the removal step are respectively repeated N times (note: N is a predetermined integer value not less than 0, and N corresponds to a cycle count). Let an increase amount of the taper angle in the n-th (n≤N) deposition step be $\Delta\theta_{D,n}$, and an amount of decrease of the taper angle in the n-th removal step be $\Delta\theta_{T,n}$. The controller 40 adjusts process conditions of the deposition step and the removal step (such as a processing time, gas type, pressure, and a temperature) so that the following formula (1) can be satisfied.

$$85° \le \sum_{n=1}^{N} (\Delta\theta_{D,n} - \Delta\theta_{T,n}) + \theta_0 \le 95° \quad (1)$$

In FIGS. 11A to 11E, D1, D2, D3 . . . each represents a deposition step D, and T1, T2, T3 . . . each represent a removal step T. In the deposition steps D1, D2, D3 . . . , the taper angle of the side surface of the resist film 108 increases, and in the removal steps T1, T2, T3 . . . , the taper angle of the side surface of the resist film 108 decreases.

Figure 11A:
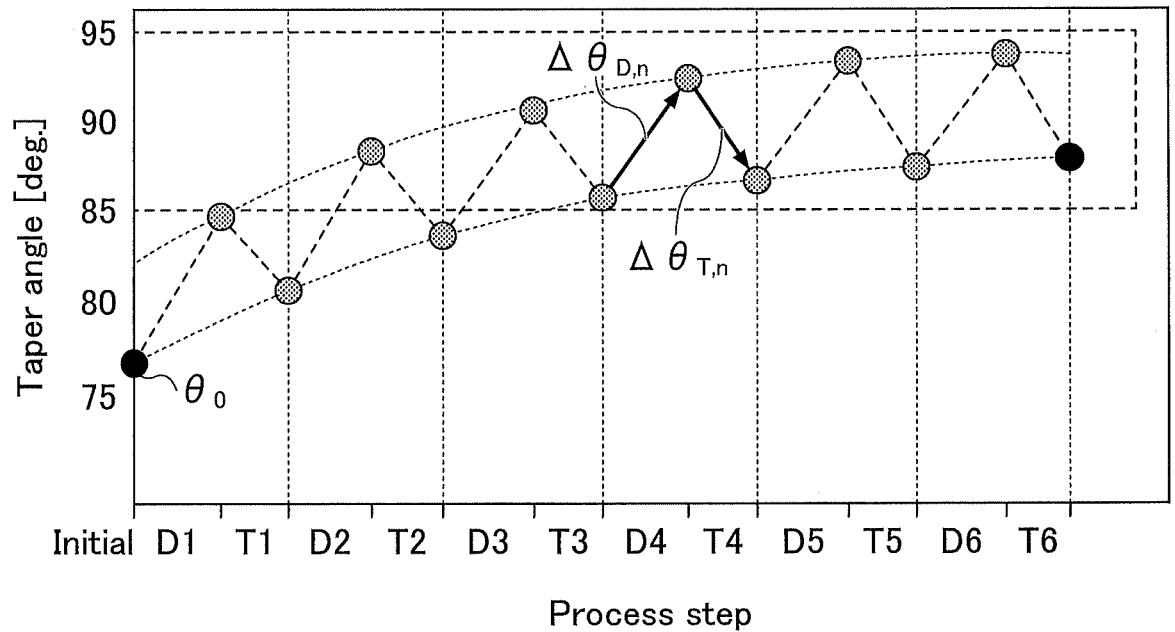
FIGS. 11A to 11E are diagrams explaining a method of adjusting a taper angle substrate processing according to the embodiment.

Formula (1) illustrates a condition in which the taper angle becomes between 85° and 95°, in a case in which a change amount of the taper angle differs in each step (deposition step and removal step), as illustrated in FIG. 11A.

Figure 11B:
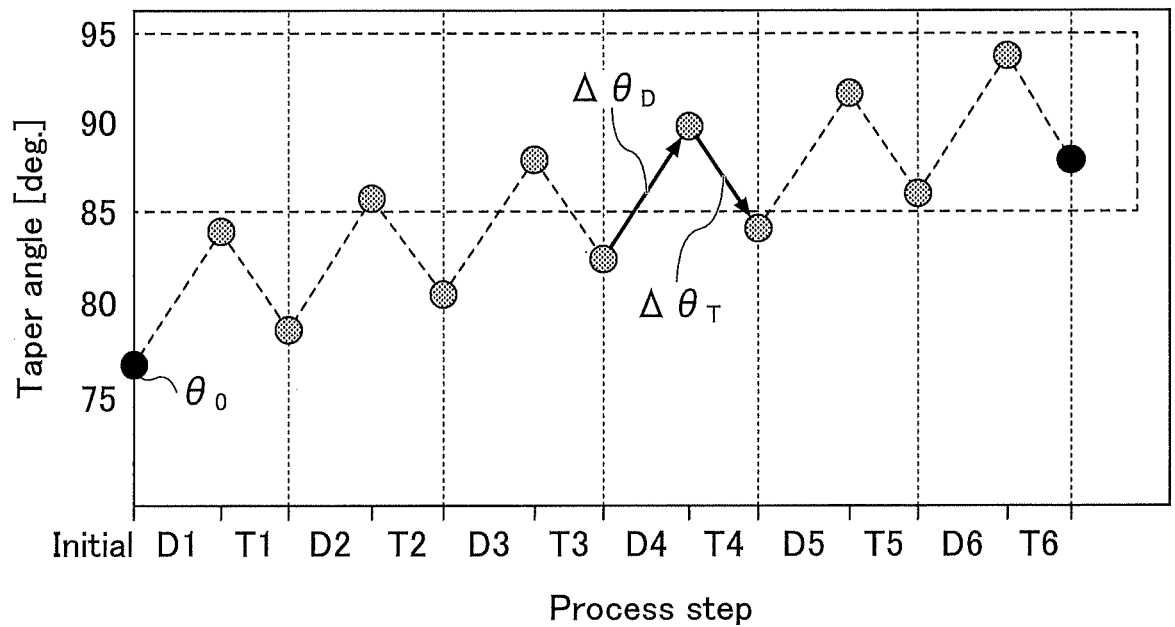

Formula (2) illustrates a condition in which the taper angle is between 85° and 95° in a case in which the amount of increase of the taper angle in each of the deposition step is the same and the amount of decrease of the taper angle in each of the removal step is the same (that is, $\Delta\theta_{D,1} = \Delta\theta_{D,2} = \Delta\theta_{D,3} = \ldots = \Delta\theta_{D,N} = \Delta\theta_D$ and $\Delta\theta_{T,1} = \Delta\theta_{T,2} = \Delta\theta_{T,3} \ldots = \Delta\theta_{T,N} = \Delta\theta_T$ are established), as illustrated in FIG. 11B.

$$85° \le (\Delta\theta_D - \Delta\theta_T) \times N + \theta_0 \le 95° \quad (2)$$

The process condition to be adjusted is a processing time of the deposition step, a processing time of the removal step, a type of gas used in the deposition step, pressure during the deposition step, a temperature during the deposition step, or combinations thereof. For example, in order to adjust the processing time of the deposition step and the processing time of the removal step, data indicating a relationship between a processing time (time of deposition step, time of removal step) and a taper angle (as illustrated in the graphs in FIGS. 6A and 6B) may be obtained in advance, and may be stored in the ROM 42 or RAM 43. When performing the cycle step(s) (deposition step and/or removal step), the CPU 41 may adjust the processing time based on the data.

Also, for example, with respect to the type of gas used in the deposition step, data indicating a relationship between a processing time (time of deposition step) and a taper angle may be obtained in advance for each type of gas, as illustrated in the graph of FIG. 8, and may be stored in the ROM 42 or RAM 43. The CPU 41 may adjust the process conditions based on the data.

Also, for example, with respect to the pressure during the deposition step, data indicating a relationship between pressure and a taper angle, as illustrated in the graph of FIG. 9A, may be obtained in advance and may be stored in the ROM 42 or the RAM 43. The CPU 41 may adjust the process conditions based on the data.

Also, for example, with respect to the temperature during the deposition step, data indicating a relationship between a temperature and a taper angle, as illustrated in the graph of FIG. 10A, may be obtained in advance and may be stored in the ROM 42 or the RAM 43. The CPU 41 may adjust the process conditions based on the data.

As examples of adjustment of process conditions, adjustment of a processing time of the deposition step and/or the removal step, a type of gas used in the deposition step, pressure during the deposition step, and a temperature during the deposition step, are described above. However, adjustment of process conditions is not limited to the above examples. For example, data indicating a relationship between a taper angle and a gas type used in the removal step, pressure during the removal step, a temperature during the removal step, or other process parameters may be stored in the ROM 42 or the RAM 43 in advance, and the CPU 41 may adjust process conditions based on the data.

In this case, in a case in which a cycle count (the number of times the deposition and removal steps are repeated) is two or more, the process conditions of the n-th deposition step and the (n+1)-th deposition step may be the same, or may be different.

Furthermore, in a case in which a cycle count is two or more, the process conditions of the n-th removal step and the (n+1)-th removal step may be the same, or may be different, regardless of whether the n-th deposition step and the (n+1)-th deposition step have the same or different process conditions.

Figure 11C:
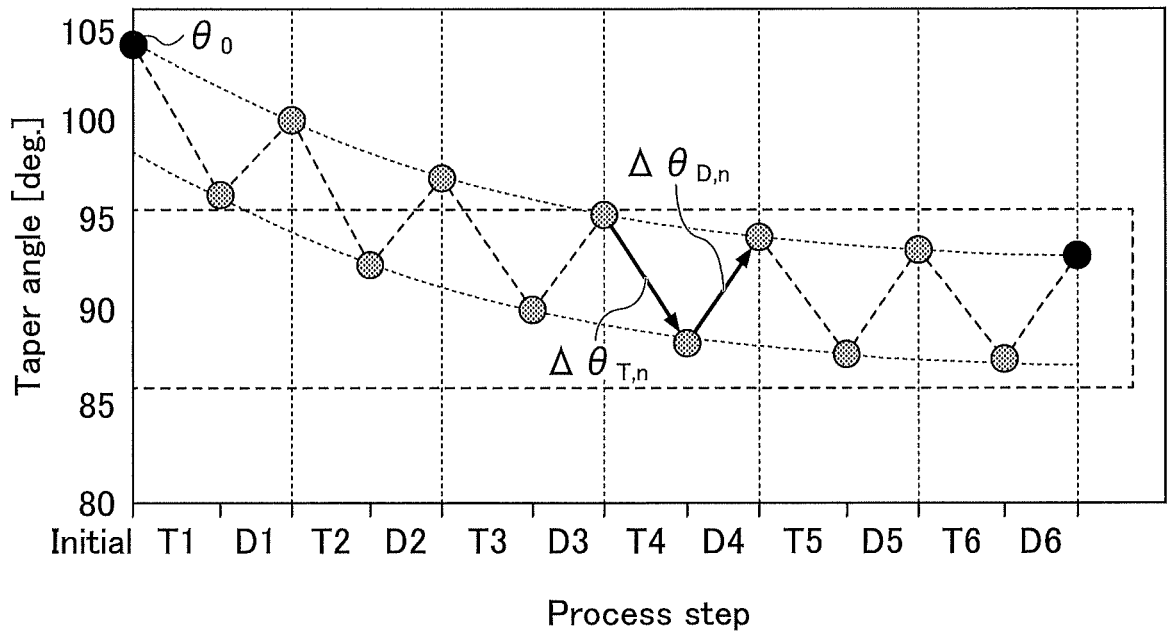

In the above-described processing method, the deposition step is performed first, the removal step is then performed, and the deposition step and the removal step are repeated several times. However, the present invention is not limited thereto. For example, as illustrated in FIG. 11C, the removal step may be performed first, and then the deposition step may be performed. In particular, in a case in which an initial taper angle is greater than 90°, if a step of reducing the taper angle (that is, the removal step) begins first, the taper angle can become in a predetermined angle at an earlier stage.

Formula (3) illustrates a condition in which the taper angle becomes between 85° and 95°, in a case in which the change amount of the taper angle differs in each step, as illustrated in FIG. 11C.

$$85° \le \sum_{n=1}^{N} (-\Delta\theta_{T,n} + \Delta\theta_{D,n}) + \theta_0 \le 95° \quad (3)$$

In the above description, in a case in which the deposition step and the removal step are repeated, both the deposition step and the removal step are executed the same number of times, but the above is not limited thereto. For example, in a case in which the deposition step is performed first and the removal step is performed next as illustrated in FIG. 11D, the deposition step may be performed N times while the removal step is performed (N−1) times.

Figure 11D:
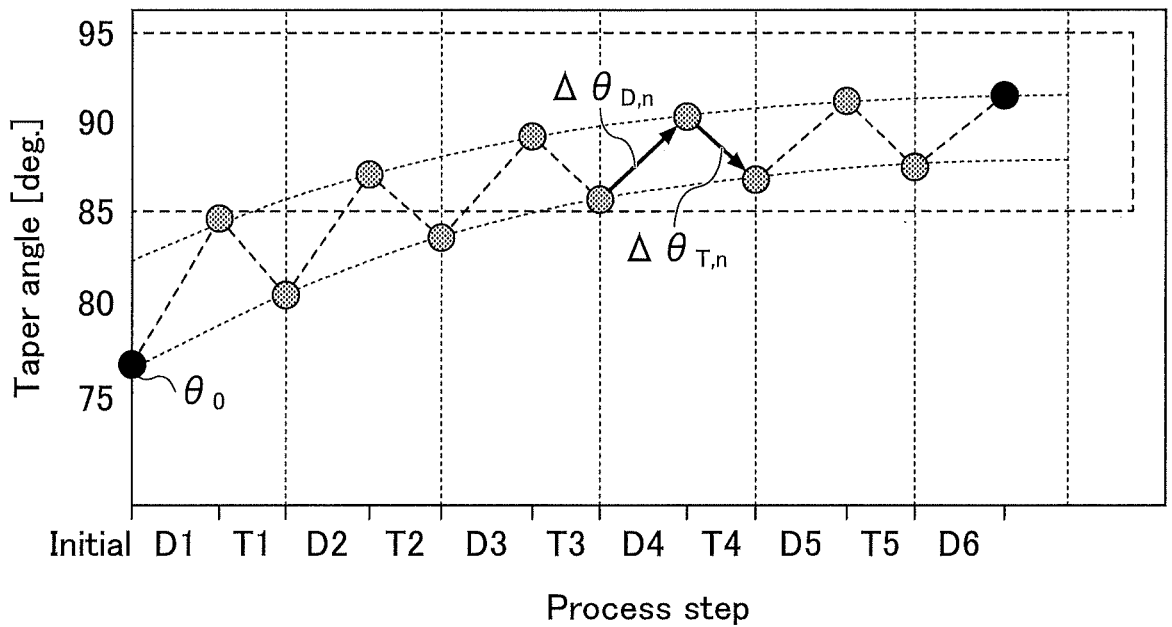

Formula (4) illustrates a condition in which the taper angle becomes between 85° and 95°, in a case in which the change amount of the taper angle differs in each step, as illustrated in FIG. 11D.

$$85° \le \sum_{n=1}^{N}(\Delta\theta_{D,n} - \Delta\theta_{T,n}) + \theta_0 \le 95° \quad (4)$$

where $\Delta\theta_{T,N}=0$.

In a case in which the removal step is performed first and the deposition step is performed next, the removal step may be performed N times while the deposition step is performed (N−1) times.

Also, in the above-described embodiment, while performing a certain deposition step (n-th deposition step, for example) or while performing a certain removal step (n-th removal step, for example), the step (deposition step or removal step) is performed under a single process condition, but is not limited thereto. For example, a deposition step may be composed of multiple sub-steps, and parameters such as a gas type, pressure, or a temperature may be switched or changed in each of the multiple sub-steps during the deposition step. Alternatively, a removal step may be composed of multiple sub-steps, and parameters such as a gas type, pressure, or a temperature may be switched or changed in each of the multiple sub-steps.

Figure 11E:
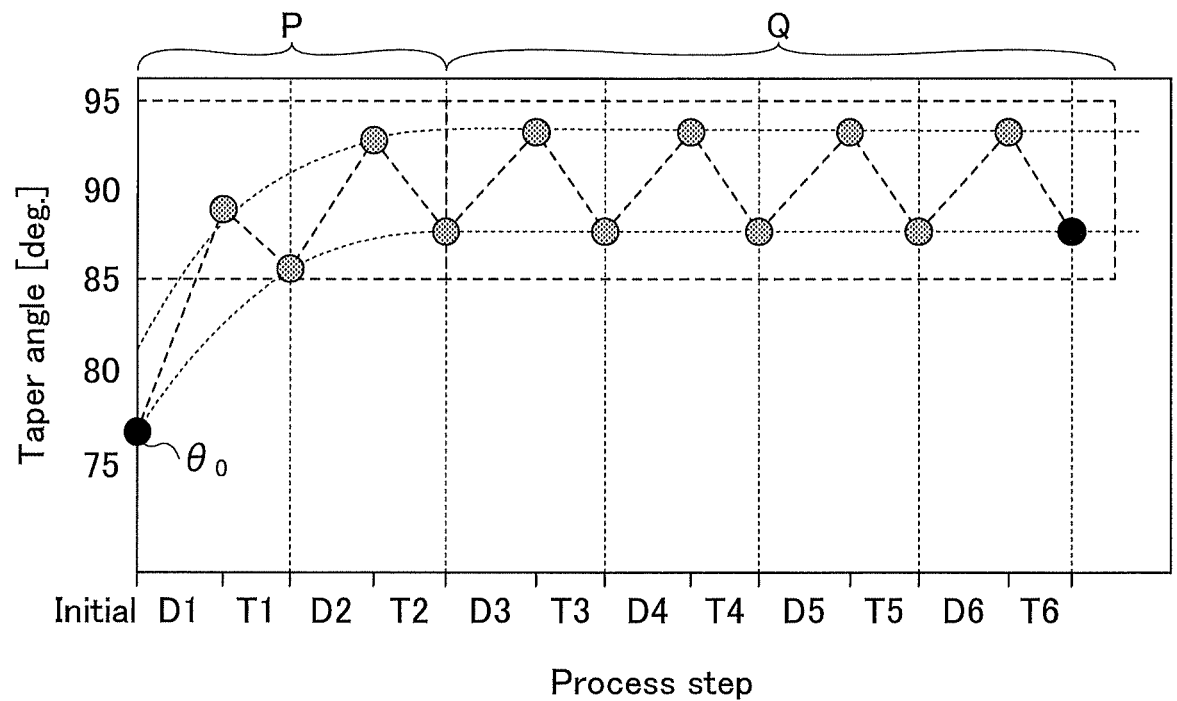

In addition, the controller 40 may divide the multiple cycle steps, each of which is composed of the deposition step and the removal step, into two groups as illustrated in FIG. 11E, and may execute each of the two groups (of the cycle steps) under different process conditions. In the following, a first group of the two groups is referred to as a "phase P", and a second group of the two groups is referred to as a "phase Q". In this case, in the phase P, the controller 40 performs control such that the side surface of the resist film 108 becomes almost vertical. For example, in the example of FIG. 11E, the controller 40 performs control such that the taper angle becomes between 85° and 95°. Thereafter, in the phase Q, the controller 40 performs control such that the side surface of the resist film 108 satisfies the following Formula (5), while making a shape of the side surface of the resist film 108 almost vertical. In the example of FIG. 11E, the controller 40 performs control such that the taper angle is between 85° and 95° while satisfying Formula (5).

$$\Delta\theta_D - \Delta\theta_T \approx 0° \quad (5)$$

Thus, the side surface of the resist film 108 can be adjusted to be substantially vertical in the phase P, and in the phase Q, irregularities of the pattern surface can be reduced and the pattern surface can be made to be smooth while maintaining the vertical shape of the side surface of the resist film 108. That is, in the first phase (phase P), the taper angle can be controlled. Further, in the second phase (phase Q), deposits are deposited preferentially on a recess of the pattern surface in the deposition step, and the removal step causes etching to proceed from a protuberance of the pattern surface. This can reduce irregularities on the surface of the pattern while maintaining the taper angle in a substantially vertical shape.

The processing method and the substrate processing apparatus according to the present embodiment disclosed herein are to be considered exemplary in all respects and not limiting. The above embodiment may be modified and enhanced in various forms without departing from the appended claims and gist thereof. Matters described in the above embodiment may take other configurations to an extent not inconsistent, and may be combined to an extent not inconsistent.

The substrate processing apparatus of the present disclosure is applicable to any types of substrate processing apparatuses, such as a capacity coupled plasma (CCP) type, an inductively coupled plasma (ICP) type, a radial line slot antenna (RLSA) type, an electron cyclotron resonance plasma (ECR) type, and a helicon wave plasma (HWP) type.

In the present specification, a wafer W has been described as an example of a substrate. However, the substrate may not be limited thereto, and may be various types of substrates used in a flat panel display (FPD), a printed circuit board, or the like.

What is claimed is:

1. A processing method comprising:
   a) providing a substrate having a mask layer that is disposed over a surface of the substrate, the mask layer having a first hole and a second hole extending therethrough, an opening of the first hole being larger than an opening of the second hole;
   b) depositing a first deposit on a side surface of the first hole and a second deposit on a side surface of the second hole by use of a plasma of at least one of $CH_4$ gas, $H_2$ gas, Ar gas, $N_2$ gas, $CH_3F$ gas, $CH_2F_2$ gas, or $C_4F_8$ gas, the first deposit having a greater maximum thickness than the second deposit;
   c) reducing the respective thicknesses of the first and second deposits by substantially the same amount by use of a plasma of at least one of $CO_2$ gas, $CH_4$ gas, or CO gas; and
   d) repeating b) and c) at least once, thereby causing a taper angle of the side surface of the first hole and a taper angle of the side surface of the second hole to be within a specified range of angles, and reducing variation in size of respective openings of the first hole.

2. The processing method according to claim 1, wherein the taper angle of the side surface of the first hole and the taper angle of the side surface of the second hole are controlled within a range between 85° and 95°.

3. The processing method according to claim 2, wherein a process condition during execution of b) and c) is adjusted such that a following formula is established, $$85° \le \sum_{n=1}^{N}(\Delta\theta_{D,n} - \Delta\theta_{T,n}) + \theta_0 \le 95°$$

wherein $\theta_0$ is the taper angle of each of the side surface of the first hole and the taper angle of the side surface of the second hole in an initial state, N is a number of executions of b) and c) (N is a non-negative integer), $\Delta\theta_{D,n}$ is an amount of taper angle increase as a result of n-th execution of b) (n≤N), and $\Delta\theta_{T,n}$ is an amount of taper angle decrease as a result of n-th execution of c).

4. The processing method according to claim 3, wherein the process condition is an execution time of b), an execution time of c), a type of gas used during the execution of b), pressure during the execution of b), a temperature during the execution of b), or combinations thereof.

5. The processing method according to claim 1, further comprising:
   after a) and before b), performing treatment of the mask layer with $H_2$ gas plasma or HBr gas plasma.

6. The processing method according to claim 1, further comprising:
   after d), etching a film on the substrate in a pattern of the mask layer.

7. The processing method according to claim 1, wherein, in a case in which b) is repeated more than once, a process condition during an n-th (n is a non-negative integer) execution of b) is same as a process condition during an (n+1)-th execution of b).

8. The processing method according to claim 1, wherein, in a case in which b) is repeated more than once, a process condition during an n-th (n is a non-negative integer) execution of b) is different from a process condition during an (n+1)-th execution of b).

9. The processing method according to claim 1, wherein, in a case in which b) is repeated more than once, a process condition during an n-th (n is a non-negative integer) execution of c) is same as a process condition during an (n+1)-th execution of c).

10. The processing method according to claim 1, wherein, in a case in which c) is repeated more than once, a process condition during an n-th (n is a non-negative integer) execution of c) is different from a process condition during an (n+1)-th execution of c).

11. The processing method according to claim 1, wherein d) causes the respective openings of the first hole and the second hole to be made the same size.

12. The processing method according to claim 1, wherein in b), deposits are more likely to adhere to upper portions of the side surfaces of the first and second holes than to lower portions thereof, and in c), the deposits are more likely to be removed at the upper portions of the side surfaces of the first and second holes than at the lower portions thereof.

13. A substrate processing apparatus comprising:
   a processing vessel; and
   a controller configured to control a process performed in the processing vessel, the process being applied to a substrate having a mask layer that is disposed over a surface of the substrate; wherein the process includes
   a) providing the substrate having the mask layer, the mask layer having a first hole and a second hole extending therethrough, an opening of the first hole being larger than an opening of the second hole;
   b) depositing a first deposit on a side surface of the first hole and a second deposit on a side surface of the second hole by use of a plasma of at least one of $CH_4$ gas, $H_2$ gas, Ar gas, $N_2$ gas, $CH_3F$ gas, $CH_2F_2$ gas, or $C_4F_8$ gas, the first deposit having a greater maximum thickness than the second deposit;
   c) reducing the respective thicknesses of the first and second deposits by substantially the same amount by use of a plasma of at least one of $CO_2$ gas, $CH_4$ gas, or CO gas; and
   d) repeating b) and c) at least once, thereby causing a taper angle of the side surface of the first hole and a taper angle of the side surface of the second hole to be within a specified range of angles, and reducing variation in size of respective openings of the first hole and the second hole.

* * * * *